US010374567B2

(12) United States Patent
Mendes et al.

(10) Patent No.: US 10,374,567 B2
(45) Date of Patent: Aug. 6, 2019

(54) METHOD FOR ADAPTING THE VOLUME GAIN FOR THE POWER LIMITATION OF AN AMPLIFIER AND AMPLIFIER

(71) Applicant: DEVIALET, Paris (FR)

(72) Inventors: Eduardo Mendes, Chabeuil (FR); Pierre-Emmanuel Calmel, Le Chesnay (FR)

(73) Assignee: DEVIALET, Paris (FR)

( * ) Notice: Subject to any disclaimer, the term of this patent is extended or adjusted under 35 U.S.C. 154(b) by 0 days.

(21) Appl. No.: 15/544,786

(22) PCT Filed: Jan. 19, 2016

(86) PCT No.: PCT/EP2016/051014
§ 371 (c)(1),
(2) Date: Jul. 19, 2017

(87) PCT Pub. No.: WO2016/116444
PCT Pub. Date: Jul. 28, 2016

(65) Prior Publication Data
US 2017/0373657 A1    Dec. 28, 2017

(30) Foreign Application Priority Data

Jan. 19, 2015  (FR) ..................... 15 50408

(51) Int. Cl.
*H03G 7/08*   (2006.01)
*H03G 3/12*   (2006.01)
(Continued)

(52) U.S. Cl.
CPC ............. *H03G 7/08* (2013.01); *H03G 3/12* (2013.01); *H03G 7/002* (2013.01); *H04R 3/007* (2013.01);
(Continued)

(58) Field of Classification Search
CPC ............ H03G 7/08; H03G 3/12; H03G 7/002; H03R 3/007; H04R 2400/00; H04R 2430/01
(Continued)

(56) References Cited

U.S. PATENT DOCUMENTS

2007/0036362 A1  2/2007  Chiu et al.
2007/0206820 A1  9/2007  Ikawa
2015/0010168 A1  1/2015  Cheng et al.

OTHER PUBLICATIONS

International Search Report for PCT/EP2016/051014, dated Apr. 20, 2016.
(Continued)

*Primary Examiner* — Vivian C Chin
*Assistant Examiner* — Douglas J Suthers
(74) *Attorney, Agent, or Firm* — B. Aaron Schulman, Esq.; Stites & Harbison, PLLC

(57) ABSTRACT

A method is provided for adapting an applied volume gain in an audio amplifier controlling at least one loudspeaker of an enclosure according to a desired volume gain selected by a user on a scale increased by a maximum desired volume gain, including determining effective intensity applied to the loudspeaker, calculating maximum volume gain from the desired volume gain, an effective intensity applied to the at least one loudspeaker, thermal characteristics of the loudspeaker, and the maximum desired volume gain, then calculating a variable applied volume gain according to an increasing monotonic function providing a variable applied volume gain according to the desired volume gain such that the image of the maximum desired volume gain by the monotonic function is equal to the maximum volume gain, and applying to the amplifier as applied volume gain, the minimum of the desired volume gain and the variable applied volume gain.

6 Claims, 2 Drawing Sheets

(51) Int. Cl.
*H03G 7/00* (2006.01)
*H04R 3/00* (2006.01)

(52) U.S. Cl.
CPC ...... *H04R 2400/00* (2013.01); *H04R 2430/01* (2013.01)

(58) Field of Classification Search
USPC ........................................ 381/109, 104, 106
See application file for complete search history.

(56) References Cited

OTHER PUBLICATIONS

Written Opinion of the International Searching Authority for PCT/EP2016/051014, dated Apr. 20, 2016.
Preliminary Search Report for FR 1550408, completed Nov. 17, 2015.

METHOD FOR ADAPTING THE VOLUME GAIN FOR THE POWER LIMITATION OF AN AMPLIFIER AND AMPLIFIER

The present invention relates to a method for adapting the applied volume gain in an audio amplifier controlling at least one loudspeaker of an enclosure according to the desired volume gain selected by a user on a scale increased by a maximum desired volume gain.

An electrodynamic loudspeaker is an electromechanical device used to convert an electrical voltage that is applied across its terminals to an acoustic pressure. Due to the resistance of the coil of the loudspeaker and the current circulating therein, thermal heating appears. The loudspeaker has a certain capacity to dissipate the thermal energy that it creates into its environment. However, when the electrical energy received by the loudspeaker produces a thermal energy exceeding what it is capable of dissipating, the temperature of the coil of the loudspeaker may increase beyond an acceptable value, which leads to the destruction of the coil and therefore of the loudspeaker.

It is known to implement methods and devices that limit the thermal power produced by the loudspeaker, by limiting the current circulating in the coil.

These methods commonly use the voltage applied to the loudspeaker to send it into a model whose output is compared to a threshold to act on the voltage applied to the loudspeaker. More complex models measure the current traversing the coil. To avoid overheating of the loudspeaker, the volume gain desired by the user is reduced automatically so as to limit the thermal power in the loudspeaker. The desired volume gain is the setpoint applied by the user to adjust the sound level produced by the enclosures. The user perceives this variation. To attenuate the variation perceived by the user, time constants limiting the variation speed of the desired volume gain are added to the power limiting device. The devices limiting the variation speed are difficult to adjust, and most of the time lead to a hunting phenomenon.

The invention aims to make it possible to limit the thermal power dissipated by the loudspeaker while avoiding the perception of the variation in the energy supplied to the loudspeaker by the user and the pumping phenomena.

To that end, the invention relates to a method of the aforementioned type, characterized in that it comprises the following steps:

determining the effective intensity applied to at least one loudspeaker, calculating a maximum volume gain from:
the desired volume gain,
the effective intensity applied to the loudspeaker,
thermal characteristics of the loudspeaker,
the maximum desired volume gain, calculating an increasing monotonic function providing a variable applied volume gain according to the desired volume gain such that the image of the maximum desired volume gain by the monotonic function is equal to the maximum volume gain, applying, to the amplifier, as applied volume gain, the minimum of the maximum volume gain and the variable applied volume gain for the desired volume gain.

According to specific embodiments, the method includes one or more of the following features:
the monotonic function is an affine function;
the monotonic function is given by:

$$(G_{Volume})_{max\ variable} = (G_{Volume})_{max} \times \left( \alpha + (1-\alpha) \times \frac{G_{Volume\ désiré} - (G_{Volume})_{max}}{(G_{Volume\ désiré})_{max} - (G_{Volume})_{max}} \right)$$

in which $\alpha$ is a value comprised between 0 and 1;
$(G_{Volume})_{max\ variable}$ is the variable applied volume gain;
$(G_{Volume})_{max}$ is the maximum volume gain;
$(G_{Volume\ désiré})$ is the desired volume gain; and
$(G_{Volume\ désiré})_{max}$ is a maximum desired volume gain.
a step for calculating the individual maximum volume gain is carried out for each loudspeaker from:
the desired volume gain,
the effective intensity applied to the loudspeaker,
thermal characteristics of the loudspeaker,
and the maximum volume gain is determined from individual maximum volume gains.
the maximum volume gain is the minimum of the individual maximum volume gains and the maximum desired volume gain.

The invention also relates to an amplifier including:
means for determining the effective intensity applied to at least one loudspeaker;
means for calculating a maximum volume gain from:
the desired volume gain,
the effective intensity applied to the loudspeaker,
thermal characteristics of the loudspeaker,
the maximum desired volume gain,
means for calculating an increasing monotonic function providing an variable applied volume gain according to the desired volume gain such that the image of the maximum desired volume gain by the monotonic function is equal to the maximum volume gain; and
means for applying, to the amplifier, as applied volume gain, the minimum of the maximum volume gain and the variable applied volume gain for the desired volume gain.

The invention will be better understood upon reading the following description, provided solely as an example and done in reference to the drawings, in which.

Figure 1:
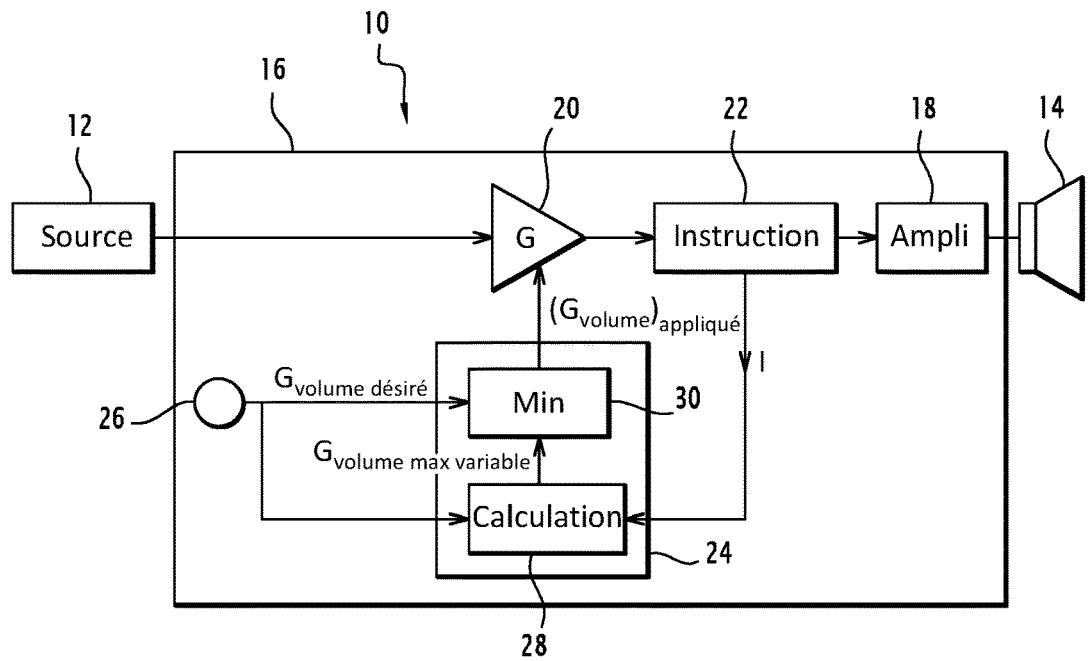
FIG. 1 is a schematic view of a sound retrieval installation.

The sound retrieval installation 10 illustrated in FIG. 1 includes a module 12 for producing an audio signal, such as a digital disc reader connected to a loudspeaker 14 through an amplifier 16.

The amplifier 16 includes a voltage amplification stage 18, the loudspeaker 14 being connected to the output thereof. Between the source 12 and the input of the amplification stage 18, the amplifier includes a stage 20 for adjusting the sound level according to an applied volume gain denoted $(G_{Volume})_{appliqué}$ whereof the output is connected to a control stage 22 able to provide an excitation signal of the loudspeaker that is provided to the amplification unit 18.

The control stage 22 is in particular able to calculate the voltage and the intensity that must be applied to the loudspeaker in order for the membrane of the loudspeaker to be, at each moment, in a determined position with a speed, acceleration, drift of the acceleration relative to time that are able to reproduce the signal received by the control unit 22. In particular, the control stage 22 is able to determine the intensity I that, at each moment, will circulate in the loudspeaker 14 after application by the amplification stage 18 according to dynamic parameters desired for the membrane of the loudspeaker.

The amplifier 16 further includes an audio volume management unit 24. This unit 24 is able to define and send the applied volume gain $(G_{Volume})_{appliqué}$ to the sound volume adjustment stage 20, to which its output is connected.

The unit 24 is connected to input means 26 for a desired volume gain noted $G_{Volume}$ desire corresponding to an expression of the sound level desired by the user. These means 26 are for example formed by a potentiometer for adjusting the sound volume accessible manually by the user. The desired volume gain $G_{Volume\ désiré}$ is adjustable manually over a scale from a minimum value to a maximum value designated by $(G_{Volume\ désiré})_{max}$.

The sound volume management unit 24 is connected to the control stage 22 to receive the instantaneous current I.

The unit 24 includes means 28 for calculating an variable applied volume gain $(G_{Volume})_{max\ variable}$ and comparison means 30 to which the input means 26 and the calculating means 28 are connected. The comparison means 30 are able to provide, to the sound level adjustment stage 20, the applied volume gain $(G_{Volume})_{appliqué}$, after a comparison between the values of the desired volume gain $G_{Volume\ désiré}$ and the variable applied volume gain $(G_{Volume})_{max\ variable}$.

The elements described here are implemented in part for each of the loudspeakers of the enclosures of the installation, which have different mechanical and/or electrical characteristics, and/or which must reproduce different source signals.

Thus, the control unit 22 is able to calculate the instantaneous current $I_i$ for each loudspeaker i and the sound volume management unit 24 receives each of the instantaneous current $I_i$.

Figure 2:
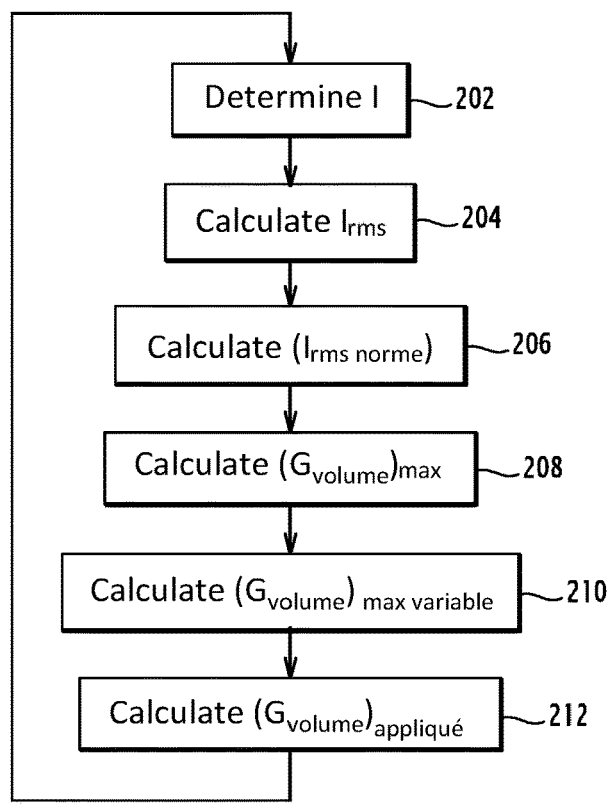
FIG. 2 is a flowchart of the method for continuously adjusting the amplification volume.

The operation of the amplifier, in particular the sound volume management unit 24, is illustrated in FIG. 2.

In step 202, the unit 24 receives the currents $I_i$ that must circulate in the loudspeakers 14 to obtain the dynamic properties of the loudspeakers 14. Each current $I_i$ is provided by the control stage 22, which, from the musical signal to be reproduced and the applied volume gain $(G_{Volume})_{appliqué}$ present at the input of the control stage 22, determines the current $I_i$ to be circulated and the voltage $U_i$ to be applied across the terminals of the loudspeaker i to obtain the desired dynamic properties.

Alternatively, the instantaneous current $I_i$ is measured across the terminals of the loudspeaker 14.

From the instantaneous value $I_i$, the effective rms (Root Mean Square) value of the instantaneous current applied to each loudspeaker, denoted $(I_{rms})_i$, is determined in step 204 by the calculating means 28, for example implementing a low-pass filter, over a chosen time depending on the thermal time constant of the loudspeaker.

In step 206, for each loudspeaker i, a normalized effective value $(I_{rms\ norm})_i$ of the current at a unitary volume gain is determined by the calculating means 28, using the formula:

$$(I_{rms\ norm})_i = \frac{(I_{rms})_i}{G_{Volume\ désiré}}$$

where $G_{Volume\ désiré}$ is the value of the desired volume gain introduced by the user from the input means 26, and $(I_{rms})_i$ is the effective value of the instantaneous current that must be applied to the loudspeaker.

In step 208, a maximum volume gain $((G_{Volume})_{max})_i$ is determined by the calculating means 28 using the formula:

$$(G_{Volume\ max})_i = \frac{(I_{rms\ max})_i}{(I_{rms\ norm})_i}$$

where $$(I_{rms\ max})_i = \sqrt{\frac{(P_i)_{max}}{(R_e)_i}}$$

where $(P_i)_{max}$ is the maximum acceptable thermal power for the loudspeaker i, and $(R_e)_i$ is the resistance of the loudspeaker i.

The maximum effective current $(I_{rms\ max})_i$ is thus determined from the resistance $(R_e)_i$ of the loudspeaker and the maximum thermal power $(P_i)_{max}$ allowable by the loudspeaker.

At each moment, the maximum volume gain $(G_{Volume\ max})_i$ therefore depends on the effective intensity $(I_{rms})_i$ applied to the loudspeaker 14 as determined during step 204.

A maximum volume gain $(G_{Volume})_{max}$ for all of the loudspeakers 1 to n is calculated by the calculating means 28 using the relationship:

$$(G_{Volume})_{max} = \min(0.999 \times (G_{Volume\ désiré})_{max}, (G_{Volume\ max})_1, \ldots, (G_{Volume\ max})_n)$$

This maximum volume gain value $(G_{Volume})_{max}$ is the minimum value of the individual maximum volume gains $(G_{Volume\ max})_i$ of each loudspeaker and the desired maximum volume gain $(G_{Volume\ désiré})_{max}$, which is reduced by 0.1% for calculation implementation reasons.

In step 210, the calculation means 28 integrated into the sound volume management unit 24 determine an variable applied volume gain $(G_{Volume})_{max\ variable}$ according to the following formula:

$$(G_{Volume})_{max\ variable} = (G_{Volume})_{max} \times \left( \alpha + (1-\alpha) \times \frac{G_{Volume\ désiré} - (G_{Volume})_{max}}{(G_{Volume\ désiré})_{max} - (G_{Volume})_{max}} \right)$$

wherein:

α is a value comprised between 0 and 1 corresponding to the maximum allowed power proportion from which a power limitation begins to act. This value is set upon design of the amplifier.

$(G_{Volume})_{max\ variable}$ is the variable applied volume gain $(G_{Volume})_{max}$ is the maximum volume gain $(G_{Volume\ désiré})$ is the desired volume gain $(G_{Volume\ désiré})_{max}$ is a maximum desired volume gain More generally, the applied volume gain variable $(G_{Volume})_{max\ variable}$ is an increasing monotonic function, for example an affine function, providing an applied volume gain variable $(G_{Volume})_{max\ variable}$ according to the desired volume gain $G_{Volume\ désiré}$ such that an image of the maximum desired volume gain $(G_{volume\ désiré})_{max}$ by the monotonic function is equal to the maximum amplification gain $(G_{Volume})_{max}$.

In step 212, the comparison means 30 determines the volume gain $(G_{Volume})_{appliqué}$ applied by the sound level adjustment stage 20 as being the minimum of the desired volume gain $(G_{Volume})_{désiré}$ and the variable applied volume gain $(G_{Volume})_{max\ variable}$, i.e.:

$$(G_{Volume})_{appliqué} = \min(G_{Volume\ désiré}, (G_{Volume})_{max\ variable})$$

Figure 3:
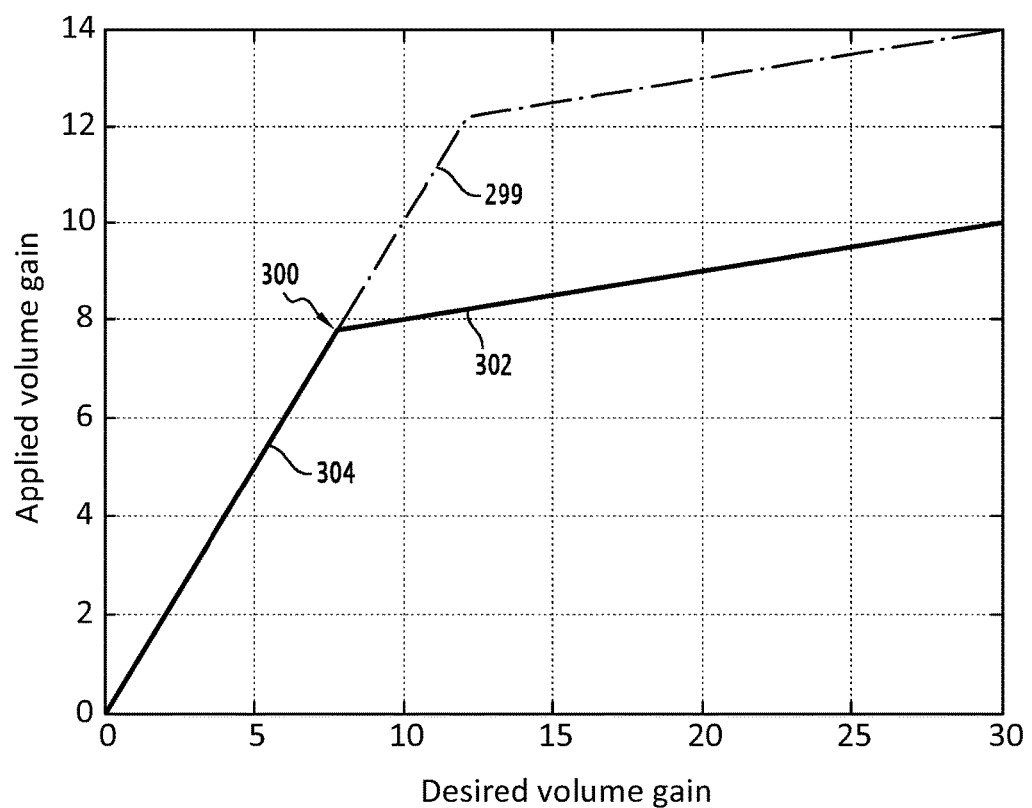
FIG. 3 is a curve illustrating the application volume applied according to the desired amplification volume by implementing the method of FIG. 2.

FIG. 3 shows the applied volume gain $(G_{Volume})_{appliqué}$ according to the desired volume gain $(G_{Volume})_{désiré}$.

The curve 299 in a continuous line shows the relationship between these two properties for a maximum volume gain $(G_{Volume})_{max}$ equal to 10, a coefficient α equal to 0.8 and a maximum desired volume gain $(G_{Volume\ désiré})_{max}$ equal to 30.

It will be understood in this case the applied volume gain $(G_{Volume})_{appliqué}$ is equal to the desired volume gain $G_{Volume\ désiré}$ up to the point of intersection 300 between the monotonic function designated by reference 302 and the line segment corresponding to the identity identified by reference 304.

The line segment 302 corresponding to the increasing monotonic function passes through the point whereof the x-axis 30 is the maximum desired volume gain and the point whereof the y-axis 10 corresponds to the maximum volume gain.

Its slope is given by $$\left((1-\alpha)\frac{G_{Volume\ désiré}}{(G_{Volume\ désiré})_{max} - (G_{Volume})_{max}}\right)$$

and is proportional to the selected value 1−α.

The mixed line shows the function providing the applied volume gain $(G_{Volume})_{appliqué}$ as a function of the desired volume gain $(G_{Volume})_{désiré}$ for a maximum volume gain $(G_{Volume})_{max}$ equal to 14 and a coefficient α kept equal to 0.8.

It will be understood that at each moment, the shape of the curve providing the applied volume gain $(G_{Volume})_{appliqué}$ as a function of the desired volume gain $G_{Volume\ désiré}$ varies according to the variation of the music and the currents $I_i$.

In light of the fact that the effective currents $(I_{rms})_i$ are obtained by low-pass-type filtering, the variations are slow in light of the variations of the musical signal. Thus, the potential decrease in the gain of the applied volume $(G_{Volume})_{appliqué}$ is slow and does not produce stray noise.

The device is of the predictive type and therefore does not include looping that could create instability or an unwanted hunting effect.

The volume gain applied to control each loudspeaker is a priori identical for each loudspeaker. Alternatively, it is different for each of the loudspeakers.

In light of the presence of the monotonic function, the method for limiting the thermal power is such that a modification of the desired volume gain $G_{Volume\ désiré}$ by the user causes a change in the applied volume gain $(G_{Volume})_{appliqué}$ with the same variation direction, even if it is not in the same proportions, while limiting the power by each loudspeaker.

Thus, the user is not unsettled by the perception of failure to take account of his desired volume variation instruction from the input means 26, even if the amplifier is working at a value close to its amplification limit value.

The invention claimed is:

1. A method for adapting an applied volume gain in an audio amplifier controlling at least one loudspeaker of an enclosure according to a desired volume gain selected by a user on a scale increased by a maximum desired volume gain, comprising:

determining an effective intensity applied to the at least one loudspeaker,
calculating a maximum volume gain from:
the desired volume gain,
the effective intensity applied to the at least one loudspeaker,
thermal characteristics of the at least one loudspeaker, and
the maximum desired volume gain,
calculating an applied volume gain variable as an increasing monotonic function, providing the applied volume gain variable according to the desired volume gain such that the image of the maximum desired volume gain by the monotonic function is equal to the maximum volume gain, and
applying, to the amplifier, as the applied volume gain, the minimum of the desired volume gain and the applied volume gain variable.

2. The method according to claim 1, wherein the monotonic function is an affine function.

3. The method according to claim 1, wherein the monotonic function is provided by:

$$(G_{Volume})_{max\ variable} = (G_{Volume})_{max} \times \left( \alpha + (1-\alpha) \times \frac{G_{Volume\ désiré} - (G_{Volume})_{max}}{(G_{Volume\ désiré})_{max} - (G_{Volume})_{max}} \right)$$

in which α is a value comprised between 0 and 1;
$(G_{Volume})_{max\ variable}$ is the applied volume gain variable;
$(G_{Volume})_{max}$ is the maximum volume gain;
$(G_{Volume\ désiré})$ is the desired volume gain; and
$(G_{Volume\ désiré})_{max}$ is the maximum desired volume gain.

4. The method according to claim 1, wherein a step for calculating an individual maximum volume gain is carried out for each loudspeaker from:
the desired volume gain,
the effective intensity applied to the respective loudspeaker,
thermal characteristics of the respective loudspeaker,
and the maximum volume gain is determined from individual maximum volume gains.

5. The method according to claim 4, wherein the maximum volume gain is the minimum of the individual maximum volume gains and the maximum desired volume gain.

6. An amplifier, including:
a volume control for selecting a desired volume gain for a user by the user on a scale increased by a maximum desired volume gain,
an adapter for adapting an applied volume gain by the amplifier of at least one loudspeaker of an enclosure according to the selected desired volume gain,
the amplifier further comprising:
an intensity detector for determining an effective intensity applied to the at least one loudspeaker,
a calculator for calculating a maximum volume gain from:
the desired volume gain,
the effective intensity applied to the at least one loudspeaker,
thermal characteristics, of the at least one loudspeaker, and
the maximum desired volume gain,
a calculator for calculating an applied volume gain variable based on an increasing monotonic function providing the applied volume gain variable according to the desired volume gain such that the image of the maximum desired volume gain by the monotonic function is equal to the maximum volume gain, and an applicator for applying as the applied volume gain the minimum of the desired volume gain and the applied volume gain variable.

* * * * *